United States Patent [19]

Watkins et al.

[11] 3,747,046

[45] July 17, 1973

[54] RECEPTACLE FOR LARGE SCALE INTEGRATED CIRCUIT (L.S.I) PACKAGE

[75] Inventors: Phillip L. Watkins, Rockville, Md.; Raymond W. Cox, Annandale, Va.; John M. Carl, Oxon Hill, Md.; John F. Judd, Falls Church, Va.

[73] Assignee: The United States of America as represented by the Secretary of the Navy, Washington, D.C.

[22] Filed: Oct. 22, 1971

[21] Appl. No.: 191,695

[52] U.S. Cl. ......... 339/17 CF, 317/101 CP, 339/174

[51] Int. Cl. ........ H05k 1/04

[58] Field of Search ........ 339/17 CF, 17 C, 339/174, 75; 317/101 CP; 324/158 F

[56] References Cited

UNITED STATES PATENTS

| | | | |
|---|---|---|---|
| 3,335,327 | 8/1967 | Damon et al. | 339/17 CF X |
| 3,407,925 | 10/1968 | Ruehlemann | 339/17 CF X |
| 3,678,385 | 7/1972 | Bruner | 324/158 F |
| 3,319,166 | 5/1967 | Coleman | 324/158 F |
| 3,297,974 | 1/1967 | Pittman | 339/17 CF |
| 3,212,047 | 10/1965 | McDonough | 339/17 CF |
| 3,380,016 | 4/1968 | Samson et al | 339/17 CF |

*Primary Examiner*—Marvin A. Champion
*Assistant Examiner*—Terrell P. Lewis
*Attorney*—R. S. Sciascia, Arthur L. Branning et al.

[57] ABSTRACT

This invention relates to a receptacle for releasably receiving an LSI package, and more particularly to improved circuit connections.

1 Claim, 3 Drawing Figures

INVENTORS
PHILIP L. WATKINS
RAYMON W. COX
JOHN M. CARL
JOHN F. JUDD

RECEPTACLE FOR LARGE SCALE INTEGRATED CIRCUIT (L.S.I) PACKAGE

STATEMENT OF GOVERNMENT INTEREST

The invention described herein may be manufactured and used by or for the Government of the United States of America for governmental purposes without the payment of any royalities thereon or therefor.

BACKGROUND OF THE INVENTION

The invention relates to receptacles for holding LSI packages in positive contact with electrical circuits for purpose of testing the internal electrical connections of the LSI package and for releasably receiving the LSI package in appropriate electronic circuitry for further use. Generally, manufactures of LSI circuits perform tests on the packages before the packages are sealed for shipping; but these tests are only directed toward the internal integrated circuitry of the device and not the connections to the outside of the package. LSI packages are generally of a large disc type with a plurality of flat leads or pins extending outwardly from the disc. Within the disc are a large number of integrated circuits, which are interconnected for whatever function is chosen for the device. These integrated circuits are normally connected to a plurality of internal connectors to which are soldered the leads which extend outside the LSI package. It is at these internal connectors (i.e., inside the disc) that the manufacture makes the circuit tests. Thus the outside connecting leads are not tested for proper electrical connection or function until the purchaser attempts to use the LSI package. Where the device will be exposed to vibration it is found to be preferable to solder all the connecting leads in place for final installation. Thus it is desirable to test the connecting leads and the LSI package function before the connecting leads are soldered in place. As it is well known, excessive heat can damage integrated circuits so as a result all unnecessary soldering should be eliminated.

LSI packages generally have 78 or more connecting leads which extend outward from the central package, with 39 leads extending from each side. This large number of leads greatly increases the hazards of damage to the package when soldering and unsoldering of these leads is necessary. Thus a need for a receptacle, which would hold the LSI package during testing, has been developed. Prior art devices have not proved to be acceptable due to the large number of very small leads.

SUMMARY OF THE INVENTION

The general purpose of the invention is to provide a receptacle for releasably receiving LSI circuit packages and testing the same.

OBJECTS OF THE INVENTION

It is, therefore, an object of the invention to provide a receptacle for testing LSI circuit packages.

Another object is the provision for releasably receiving an LSI circuit package for use in a circuit.

A further object is the direct mounting of the LSI circuit package on the printed circuit board thereby eliminating the need for a separate receptacle which must then be mounted on the printed circuit board.

DESCRIPTION OF THE DRAWINGS

The exact nature of this invention as well as the objects and advantages thereof will be readily apparent from consideration of the following specification relating to the annexed drawings in which.

DESCRIPTION OF THE PREFERRED EMBODIMENT

Figures 1, 2:
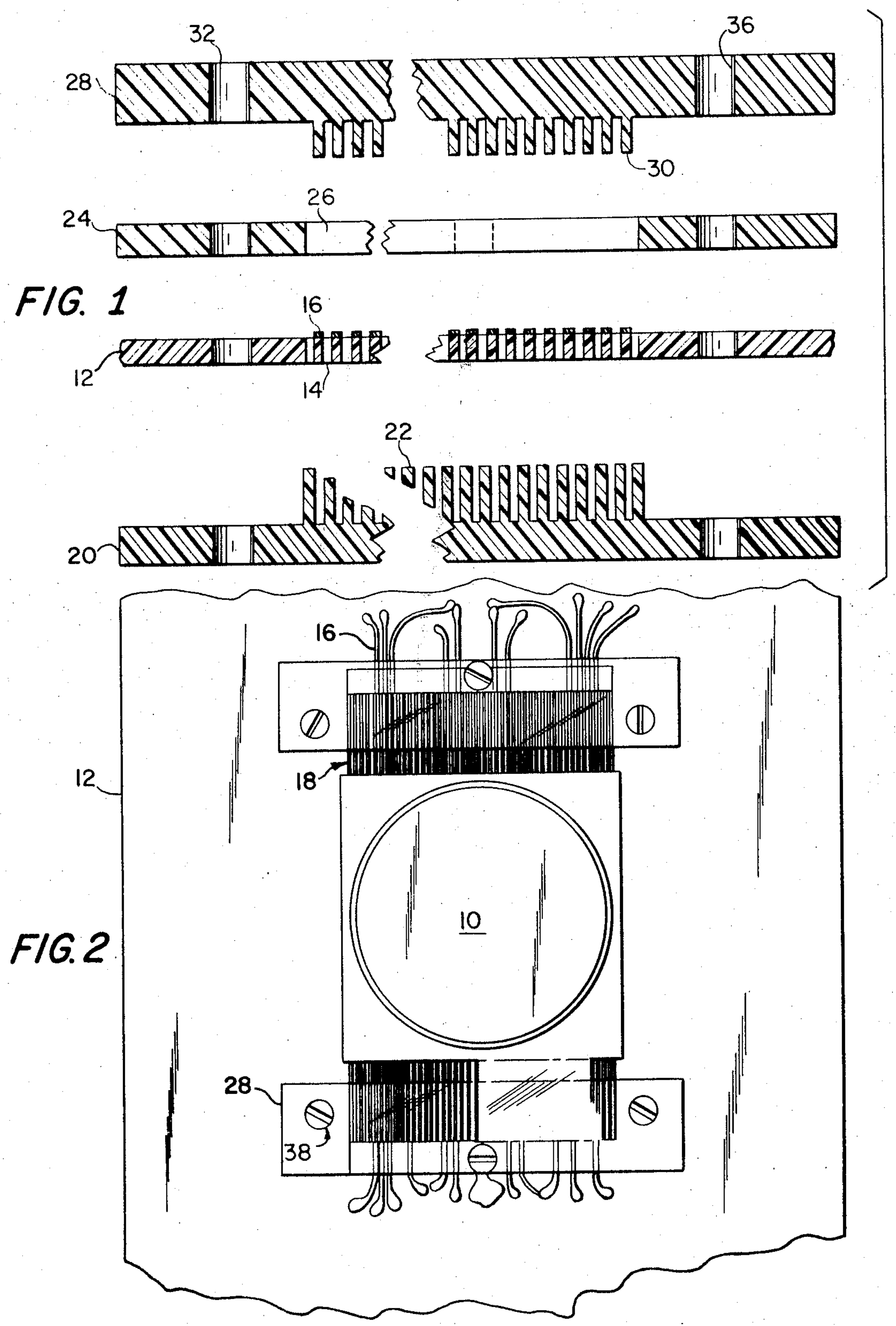
FIG. 1 is a exploded transverse section drawn to enlarged scale.
FIG. 2 is a top view of the assembly and LSI package.

Referring to the drawing and more particularly FIG. 1, an exploded section of the assembly, wherein a printed circuit board 12 is shown with slots 14 cut in a longitudinal direction. The areas between the slots having a layer of copper 16 printed on the board 12. The printed copper 16 forms the electrical contacts for the LSI package leads, which are not shown but extend in a direction perpendicular to the surface of the viewing plane. The printed copper 16 extends over the printed circuit board 12 to form a printed circuit which those skilled in the art might desire, and connects to other circuit components which may be mounted on the printed circuit board. The printed circuit board 12 circuitry, of course, is connected to some type of plug or receptacle so that the entire board 12 may be connected to or plugged into the remaining system.

The slots 14 of the board 12 are designed to receive the vertical comb 22 of the lower clamp 20. The comb 22 is designed to protrude above the surface of the printed circuit and be approximately flush with the upper surface of spacer 24 which is cut out, space 26, to receive the lower clamp comb 22 and the upper comb 30 of upper clamp 28. The upper comb 30 is designed to be received between the protrusions of lower comb 22 and press the leads of the LSI circuit package against the printed circuit conductors 16. Lower comb 22 when in place acts to guide and protect the leads of the LSI package while the upper comb 30, when held in place by a securing means (such as a bolt and nut) passing through holes 32 and 36, assures good electrical contact with the circuitry on the printed circuit board.

FIG. 2, shows a top view, not to the same scale as FIG. 1, of the assembly and an LSI package 10. As is seen in the drawing the leads 18 extend under the upper clamp 28 and over circuitry 16 diagramically shown as leads extending longitudinally beyond the upper clamp 28 to any other circuitry (not shown) which may be mounted on the printed circuit board 12.

Figure 3:
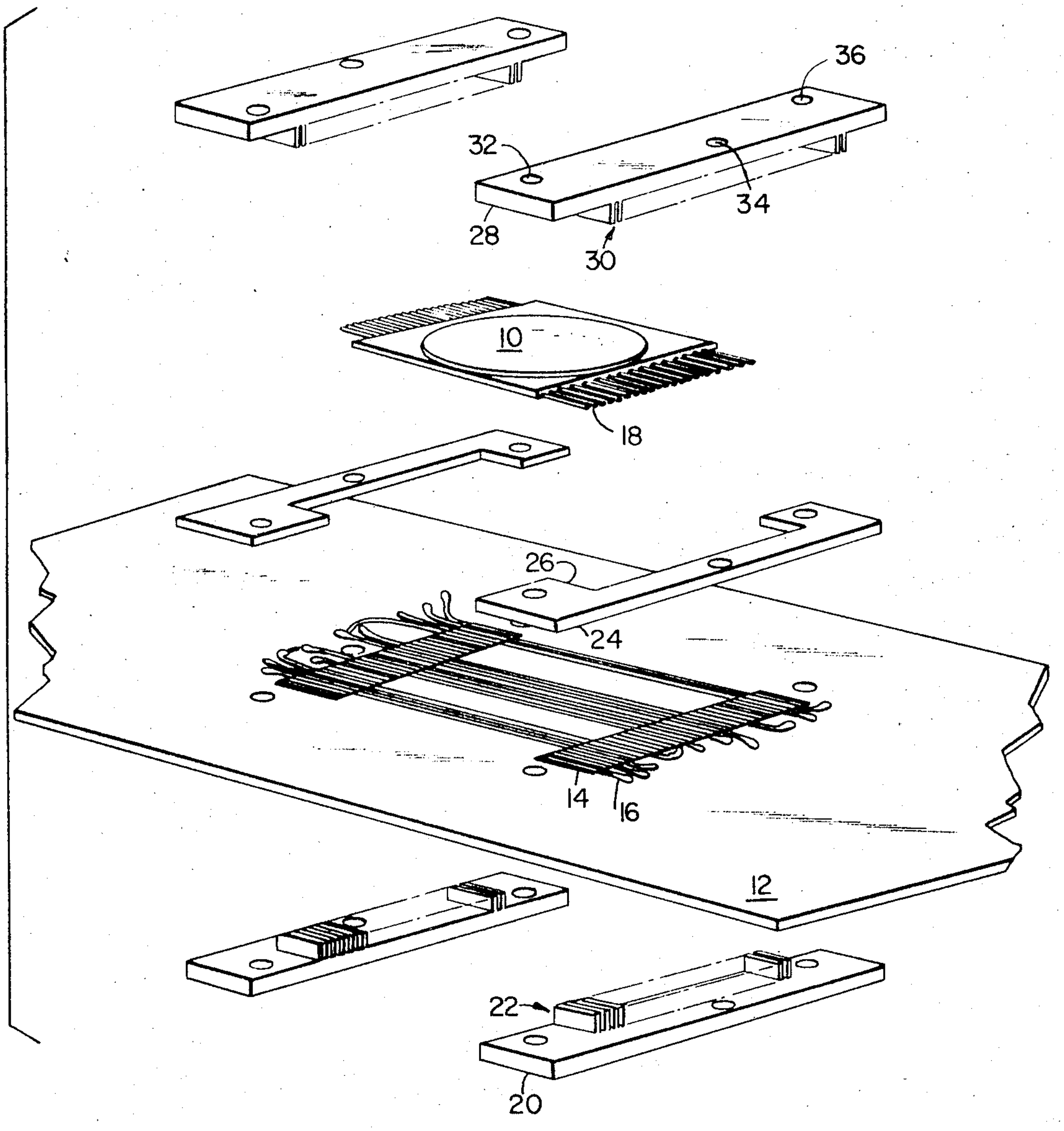
FIG. 3 is an exploded perspective view of the assembly and LSI package.

Referring now to FIG. 3 where an exploded perspective view of the assembly and LSI package 10 is shown.

In normal use the printed circuit board 12 would have printed thereon any circuitry desired by the user along with any other circuit components desired by the user for the tests or for whatever. When ready for the LSI package 10 the lower clamps 20 are inserted into position by aligning the comb 22 of clamp 20 with the slots 14 of board 12. Spacers 24 are then placed in position around the slotted area, and the LSI package is inserted into the assembly with its leads 18 resting, on the copper circuitry 16, inbetween the protrusions of the comb 22. With the addition of the upper clamps 28 positioned such that combs 30 engage the lower combs 22 and press leads 18 into good electrical contact with circuitry 16 by a fastening means 38, shown in FIG. 2. The LSI package is now ready for testing or foruse in electronic circuitry.

There has been disclosed an invention which may be used to test LSI circuit packages before installation in a final circuit or for use as a receptable in a final circuit after prior testing.

Obviously many modifications and variations of the present invention are possible in the light of the above teachings. It is therefore to be understood, that within the scope of the appended claims, the invention may be practiced otherwise than as specifically described.

What is claimed and desired to be secured by letters patent of the United States is:

1. A receptical for releasably mounting a large scale integrated circuit package having a plurality of collateral connecting leads extending outwardly from a central disc onto a printed circuit board comprising:

elongated narrow slots on said printed circuit board located substantially below said plurality of collateral connecting leads; the width of said slots being approximately equal to the width of said connecting leads;

conductive material disposed between said slots for electrically connecting the large scale integrated circuit package to said printed circuit board;

a first non-conductive base section having a plurality of protrusions extending through each of said slots such that said conductive material extends along the bottom of a plurality of channels created between said protrusions;

at least a portion of said plurality of collateral connecting leads being disposed in said slots and being electrically connected to said conductive material;

a second non-conductive base section having a plurality of protrusions extending outwardly from said second base section each protrusion being of a length which extends to substantially the bottom of said plurality of channels so that said first and said second non-conductive base sections are mated by their respective protrusions and said connecting leads from said large scale integrated circuit are engaged by the mate.

* * * * *